(12) United States Patent
Naiknaware

(10) Patent No.: US 9,423,448 B1
(45) Date of Patent: Aug. 23, 2016

(54) TESTING OF MODULE INTEGRATED ELECTRONICS USING POWER REVERSAL

(75) Inventor: Ravindranath Naiknaware, Portland, OR (US)

(73) Assignee: SunPower Corporation, San Jose, CA (US)

( * ) Notice: Subject to any disclaimer, the term of this patent is extended or adjusted under 35 U.S.C. 154(b) by 453 days.

(21) Appl. No.: 13/346,572

(22) Filed: Jan. 9, 2012

Related U.S. Application Data

(63) Continuation-in-part of application No. 13/300,362, filed on Nov. 18, 2011.

(60) Provisional application No. 61/449,695, filed on Mar. 6, 2011, provisional application No. 61/450,553, filed on Mar. 8, 2011.

(51) Int. Cl.
*G01R 31/26* (2014.01)
*G01R 31/40* (2014.01)

(52) U.S. Cl.
CPC .......... *G01R 31/2603* (2013.01); *G01R 31/405* (2013.01); *G01R 31/2605* (2013.01)

(58) Field of Classification Search
CPC .. G01R 31/26; G01R 31/2605; G01R 31/405; G01R 31/2603; G01R 31/31924; G01R 31/31922; G01R 31/31937; G01N 27/07; G01N 27/28; G01N 27/06; G01N 27/30; G01N 15/0656; H02M 7/66; H01L 31/02021; H02J 7/35; Y02E 60/12
USPC ............ 324/761.01, 750.01, 450; 307/64, 80, 307/70; 320/101; 363/13
See application file for complete search history.

(56) References Cited

U.S. PATENT DOCUMENTS

| | | | |
|---|---|---|---|
| 6,791,024 B2 | 9/2004 | Toyomura | |
| 8,138,782 B2 | 3/2012 | Elgar et al. | |
| 8,988,096 B1 | 3/2015 | Naiknaware | |
| 2005/0139258 A1* | 6/2005 | Liu et al. | 136/293 |
| 2006/0152085 A1* | 7/2006 | Flett | B60L 9/30 307/75 |
| 2007/0236187 A1* | 10/2007 | Wai | H02J 3/383 323/222 |
| 2008/0236648 A1* | 10/2008 | Klein et al. | 136/244 |
| 2009/0160259 A1 | 6/2009 | Naiknaware et al. | |
| 2009/0261810 A1 | 10/2009 | Askins et al. | |
| 2009/0308426 A1* | 12/2009 | Kernahan | 136/244 |

(Continued)

OTHER PUBLICATIONS

Sinton et al, "Flash Testing High-Efficiency Silicon Solar Cells and Modules", 20th European Photovoltaic Solar Energy Conference, 2005, 4 pages.

(Continued)

*Primary Examiner* — Jermele M Hollington
*Assistant Examiner* — Thang Le
(74) *Attorney, Agent, or Firm* — Boisbrun Hofman, PLLC

(57) ABSTRACT

A method for testing a photovoltaic (PV) module includes applying a test sequence to the integrated power converter, reversing the integrated power converter in response to the test sequence, and obtaining test results from the PV module in response to the test sequence. The test sequence may include applying reverse excitation power to output terminals of the reversible integrated power converter. The reverse excitation power may provide bootstrap power to one or more components of the integrated power converter. The test method may include activating substantially the entire reversible drive train, testing the drive train and characterizing the PV cells in the module in response to the reverse excitation power.

11 Claims, 16 Drawing Sheets

(56) References Cited

U.S. PATENT DOCUMENTS

| | | |
|---|---|---|
| 2010/0066382 A1 | 3/2010 | Merkle |
| 2010/0073011 A1 | 3/2010 | Svidenko et al. |
| 2010/0264736 A1* | 10/2010 | Mumtaz .............. H02M 7/4807 307/48 |
| 2010/0301991 A1* | 12/2010 | Sella et al. .................... 340/3.1 |
| 2011/0273130 A1* | 11/2011 | Lee et al. ...................... 320/101 |
| 2012/0043818 A1* | 2/2012 | Stratakos et al. ............... 307/77 |
| 2012/0043923 A1* | 2/2012 | Ikriannikov et al. .......... 320/103 |
| 2012/0049635 A1* | 3/2012 | Schelenz et al. ................ 307/82 |
| 2012/0062265 A1* | 3/2012 | Chaintreuil et al. ..... 324/761.01 |
| 2012/0161525 A1* | 6/2012 | Hong et al. ..................... 307/73 |
| 2012/0161527 A1* | 6/2012 | Casey ............... H01L 31/02021 307/80 |
| 2012/0215372 A1* | 8/2012 | Kernahan .......... H01L 31/02021 700/298 |
| 2012/0223584 A1* | 9/2012 | Ledenev ........... H01L 31/02021 307/82 |
| 2012/0268087 A1 | 10/2012 | Kernahan |
| 2012/0274138 A1* | 11/2012 | Bundschuh et al. ............ 307/64 |
| 2014/0152240 A1* | 6/2014 | Adest ...................... H02J 1/102 320/107 |
| 2015/0194927 A1 | 7/2015 | Naiknaware |

OTHER PUBLICATIONS

Rising Solar Equipment Co, Ltd Module Simulator & Tester, downloaded from Internet Mar. 6, 2011, 2 pages.

Sinton et al. "Flash Testing High-Efficiency Silicon Solar Cells and Modules", 20th European Photovoltaic Solar Energy Conference, 2005, 4 pages.

Sciencetech, "Large Area Flash Solar Simulator—1 m×1 m", downloaded from Internet Mar. 6, 2011, 4 pages.

3 Rising Solar Equipment Co, Lid Module Simulator & Tester, downloaded from Internet Mar. 6, 2011, 2 pages.

Eikelboom et al., "Characterisation of PV Modules of New Generations—Results of tests and simulations," 2000, 14 pages.

* cited by examiner

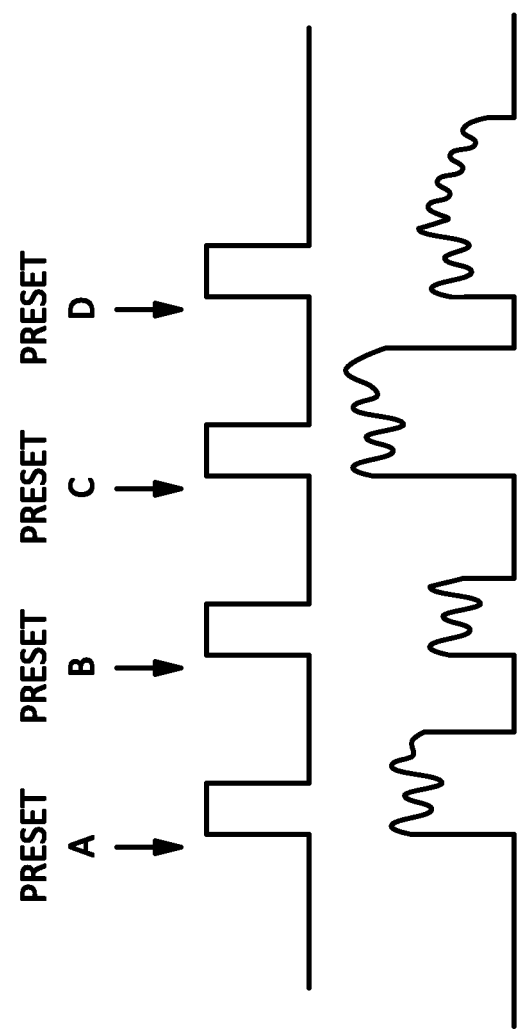

TESTING OF MODULE INTEGRATED ELECTRONICS USING POWER REVERSAL

CROSS-REFERENCE TO RELATED APPLICATIONS

This application is a Continuation-in Part of U.S. Patent Application Ser. No. 13/300,362 titled Flash Testing of Photovoltaic Modules With Integrated Electronics filed Nov. 18, 2011, and also claims priority from U.S. Provisional Patent Application Ser. Nos. 61/449,695 titled Flash Testing of Photovoltaic Modules With Integrated Electronics filed Mar. 6, 2011; and 61/450,553 titled Testing of Module Integrated Electronics Using Power Reversal filed Mar. 8, 2011; all of which are incorporated by reference.

BACKGROUND

Photovoltaic (PV) panels are fabricated with strings of PV cells connected in series to convert solar energy to electric power. In some cases the cells may be arranged as a combination of both parallel and series connections. During the manufacturing process, a variety of tests are used to determine adherence to stringent target specification tolerances on all mechanical as well as electrical aspects of the PV panels to ensure their long-term safety and reliability. These tests include a combination of visual, mechanical, optical and electrical techniques. For high-quality and high-speed manufacturing, many of these techniques are automated using computer vision, robotics and electronic instrumentation.

The electrical performance of a photovoltaic module depends on multiple factors. These factors include temperature, solar irradiance, angle-of-incidence, type of PV-cells, air mass, etc. FIG. 1 illustrates the current-voltage characteristic (I-V curve) of a typical PV panel under certain operating conditions. When the output terminals of the panel are shorted together, the output voltage (V) is zero, and the output current (I) is ISC, which is the short-circuit current generated by the panel. As the output voltage increases, the I-V curve remains at a fairly constant level of current until it reaches a knee at which point it descends rapidly toward zero current at VOC, which is the open-circuit output voltage of the panel.

PV panels are rated under standard test conditions (STC) of solar irradiance of 1,000 W/m$^2$ with zero angle of incidence, solar spectrum of 1.5 air mass and 25° C. cell temperature. PV panels have traditionally been tested by exposing the panel to simulated sunlight under the standard test conditions and collecting enough data to construct an I-V curve. From this data, key specifications may be determined include maximum rated power, open circuit voltage, short circuit current, maximum power voltage, maximum power current, and temperature coefficients. However, standard techniques for exposing a PV panel to 1,000 W/m$^2$ artificial illumination equivalent to sunlight may be prohibitively expensive, time consuming and in many cases impractical. For example, continuously exposing a PV panel to illumination at 1,000 W/m$^2$ may cause heating of the PV cells, thereby distorting the I-V characteristics to be measured for the determination of the panel performance at STC.

To eliminate the problems caused by continuous light sources, "flash" testing techniques have been developed. During flash testing of a PV module, a flash of light, typically 1 to 50 ms long, from a Xenon filled (or equivalent) arc lamp is used. The spectral properties of the arc lamp are controlled to match the spectrum of the sunlight to the extent required. Alternate flash generation technologies can involve a variety of light sources including light-emitting diodes (LEDs). The output from the PV panel in response to the flash is collected by a data acquisition system and processed using a computer to determine the I-V characteristic of the PV panel under test. The results are compared to the target specifications with appropriate tolerances to determine if the PV panel performs within the required specifications. Flash testing of PV panels is possible due to the rapid-response of the photovoltaic cells, and limited charge accumulation and storage requirements before the IV characterization tests can be adequately performed.

PV panels have traditionally been manufactured as independent components that require external power conversion apparatus to optimize the operating point of the panel and/or to convert the DC power generated by the PV panel to AC power for connection to a local utility grid. PV panels are now being fabricated as modules with integral power converters. On a typical PV module with an integral power converter, only the output terminals of the power converter are accessible for testing. The output terminals of the PV cells are sealed to protect against environmental degradation.

Conventional flash testing cannot be used on PV modules with fully integrated power converters such as power optimizers, AC microinverters and/or diagnostic and safety related communication capabilities for several reasons: (1) large inherent energy storage devices in power optimizers, AC microinverters and communication circuits; (2) large startup wattage requirements for allowing reliable startup of the module integrated electronics; (3) algorithmic latencies of maximum power point-tracking and digital control; and/or (4) connect and disconnect requirements as regulated by the standards and utilities.

BRIEF DESCRIPTION OF THE DRAWINGS

FIG. 15 illustrates how different preset patterns may be applied to the parameters of an integrated power converter according to some inventive principles of this patent disclosure.

DETAILED DESCRIPTION

Flash Testing of PV Modules with Integral Power Converters

Figure 1:
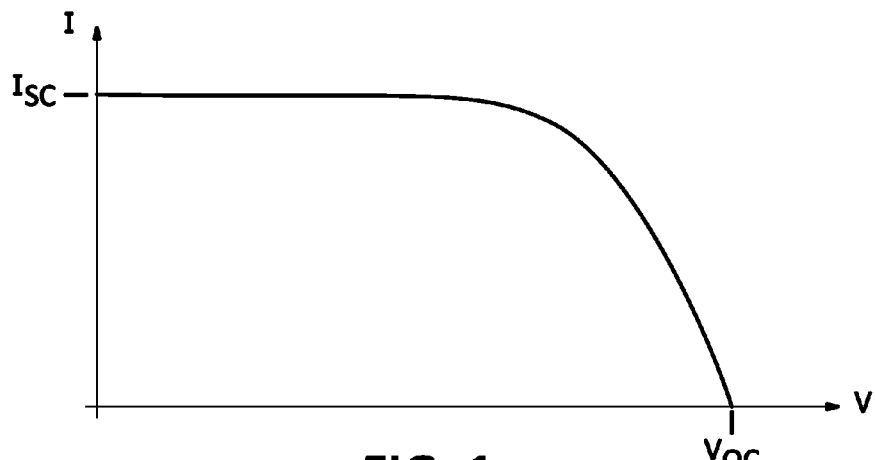
FIG. 1 illustrates the current-voltage characteristic (I-V curve) of a typical PV panel.
Figure 2:
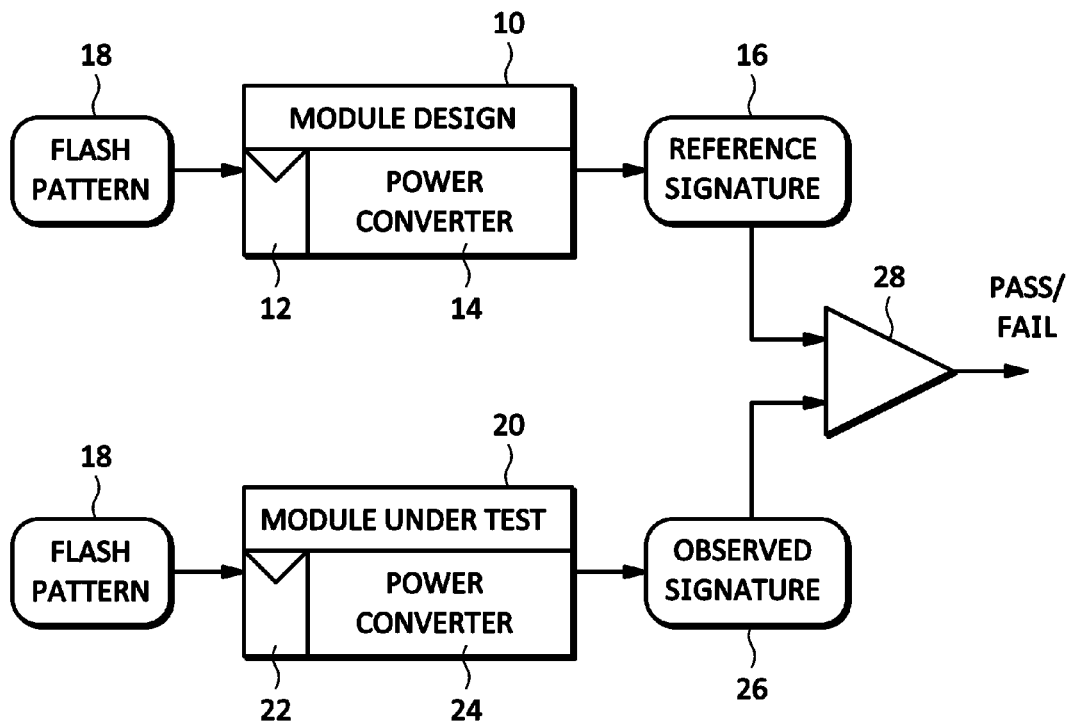
FIG. 2 illustrates an embodiment of a system for testing a PV module having an integral power converter according to some inventive principles of this patent disclosure.

FIG. 2 illustrates an embodiment of a system for testing a PV module having an integral power converter according to some inventive principles of this patent disclosure. A PV module design 10 includes an arrangement 12 of one or more PV cells and an integrated power converter 14 to process power from the arrangement of PV cells. A reference output signature 16 of the module design is obtained in response to a flash pattern 18.

The module design 10 may be embodied as a physical PV module, i.e., a known good embodiment of a design, in which case the reference output signature 16 may be obtained by observing the output of the module in response to a physical flash pattern 18 applied to the arrangement of PV cells on the module. Alternatively, the module design 10 may be a data construct in which case the reference output signature 16 may be obtained by simulating the output of the module in response to the flash pattern 18.

The signatures thus obtained from real measurement of a known-good module, or from a simulated data construct may only need to be obtained once. In practice, however, system calibration may need to be performed using alternate reference cells, or using the known-good modules much more often due to parametric variation of the system, e.g., to compensate for deterioration of luminescence of the arc-lamp or arc-flash sources with usage.

A physical module under test 20 includes an arrangement of PV cells 22 and integrated power converter 24 of the same design as the PV module design 10. The module 20 is tested by applying the same flash pattern 18 to the arrangement of PV cells 22 and acquiring an observed output signature 26 of the PV module under test in response to the flash pattern 18.

The observed output signature 26 of the PV module under test is compared to the reference output signature 16 through suitable comparison logic 28 to determine if the observed output signature 26 of the module under test 20 is close enough to the reference output signature 16 to indicate whether the module under test falls within acceptable tolerances of the target specifications. The comparison logic may be implemented in hardware, software, firmware, etc., or any suitable combination thereof, and may include mathematical and statistical techniques to validate the module under test versus the reference signatures.

Figure 3:
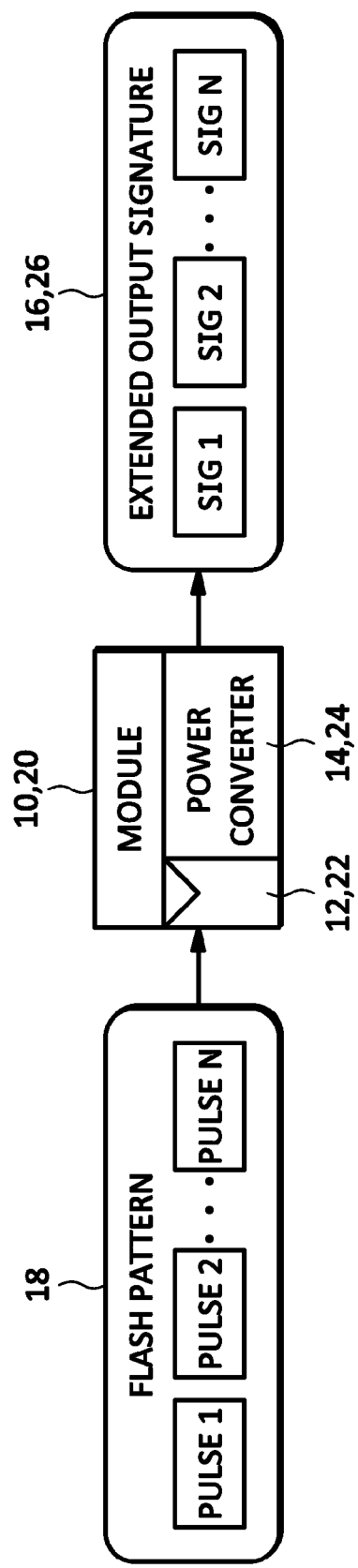
FIG. 3 illustrates a flash pattern having multiple pulses and an extended output signature according to some inventive principles of this patent disclosure.

The flash pattern 18 may consists of a single light pulse. Alternatively, as shown in FIG. 3, the flash pattern 18 may include multiple light pulses PULSE 1, PULSE 2 . . . PULSE N, in which case the reference output signature 16 and the observed output signature 26 may be extended output signatures which include multiple signatures SIG 1, SIG 2 . . . SIG N. The multiple light pulses may have different intensities and/or different pulse widths. They may be periodic in the sense that they begin or end at fixed time intervals, or the light pulses may occur at irregular intervals.

The flash pattern may be generated with a flash lamp wherein each light pulse is generated by a single optical impulse from the lamp. Alternatively, the flash pattern may be generated by using a shutter arrangement with a continuously operating lamp, such as a Xenon short art lamp.

FIGS. 4-7 illustrate some example flash patterns and corresponding output signatures for PV modules having integral power converters according to some inventive principles of this patent disclosure.

Figure 4:
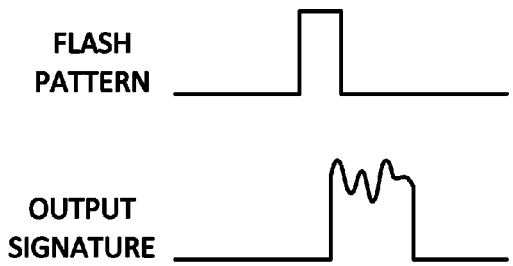
FIGS. 4-7 illustrate some example flash patterns and corresponding output signatures for PV modules having integral power converters according to some inventive principles of this patent disclosure.

FIG. 4 illustrates an example flash pattern having a single pulse and a corresponding output signature. This output signature, as well as those shown in FIGS. 5-7, are shown generically but may include implicit characterizations of charge times for input capacitors, start-up sequences for microcontrollers, rise times for inductors, on-state resistances for switching transistors, and other parameters as described in more detail below.

Figure 5:
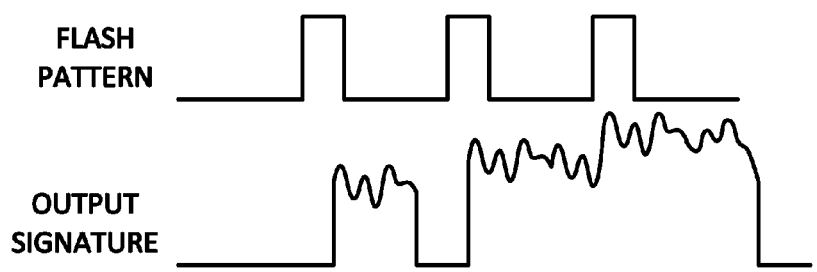

FIG. 5 illustrates an example flash pattern and corresponding output signature of light pulses having uniform intensity and width and occurring at uniform, i.e., periodic, intervals.

Figure 6:
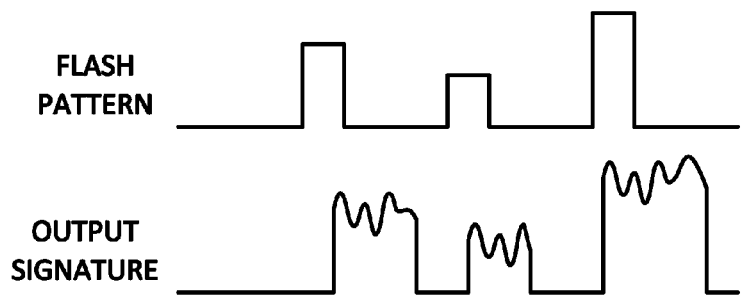

FIG. 6 illustrates an example flash pattern and corresponding output signature of light pulses having different intensities, but uniform width and intervals.

Figure 7:
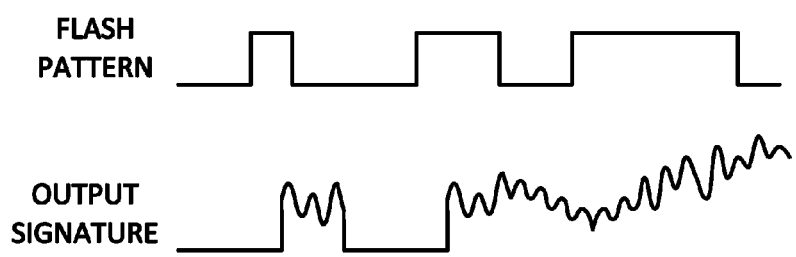

FIG. 7 illustrates an example flash pattern and corresponding output signature of light pulses having uniform intensity, but varying widths and spacing.

The patterns illustrated in FIGS. 4-7 are just a few examples for purposes of illustration. Countless other patterns and combinations of patterns may be implemented according to the inventive principles of this patent disclosure. For example, a flash pattern may also include multiple pulses having varying intensity and non-uniform durations between pulses.

Whereas prior art techniques for flash testing of PV panels obtain explicit I-V characteristics of the arrangement of PV cells on the panel, the output signatures acquired during testing of a PV module having an integral power converter according to the inventive principles of this patent disclosure may provide an implicit characterization of the I-V characteristics of the PV cells. Moreover, the output signatures may also include implicit characterizations of the integral power converter including initial charging of energy storage devices, startup wattage criterion, algorithmic latencies, etc. Thus, the inventive principles may enable the testing of the operation of all of the components of a PV module even though the output terminals of the PV cells may not be accessible. That is, opto-impulse electronic time signatures may be used in which, for a typical optical impulse from an arc lamp to a PV module with integrated electronics, all signals at the observable nodes are sampled using a high-speed data acquisition system. The signatures from multiple periodic and non-periodic flash exposures as described above may be referred to as multi-opto-impulse extended signatures.

In the embodiments described above and below, the output signatures would typically include voltage and/or current measurements taken from the output terminals of a power optimizer, microinverter, or any other form the integral power converter may take. However, the output signatures may include any other parameter that provides an indication of the compliance of the module under test with manufacturing tolerances. The output signatures may be obtained with any suitable load applied to the power converter running the entire range from open circuit to short circuit. Moreover, the load or loads may be changed to any suitable levels at different times during the test procedures. For example, in the embodiments of FIGS. 5-7, a different load may be applied to the integral power converter before, during or after each successive light pulse. In general, the load can be active or passive and may able to act as a source or sink. Furthermore, the active or passive load system may be synchronized with the flash generation system.

Figure 8:
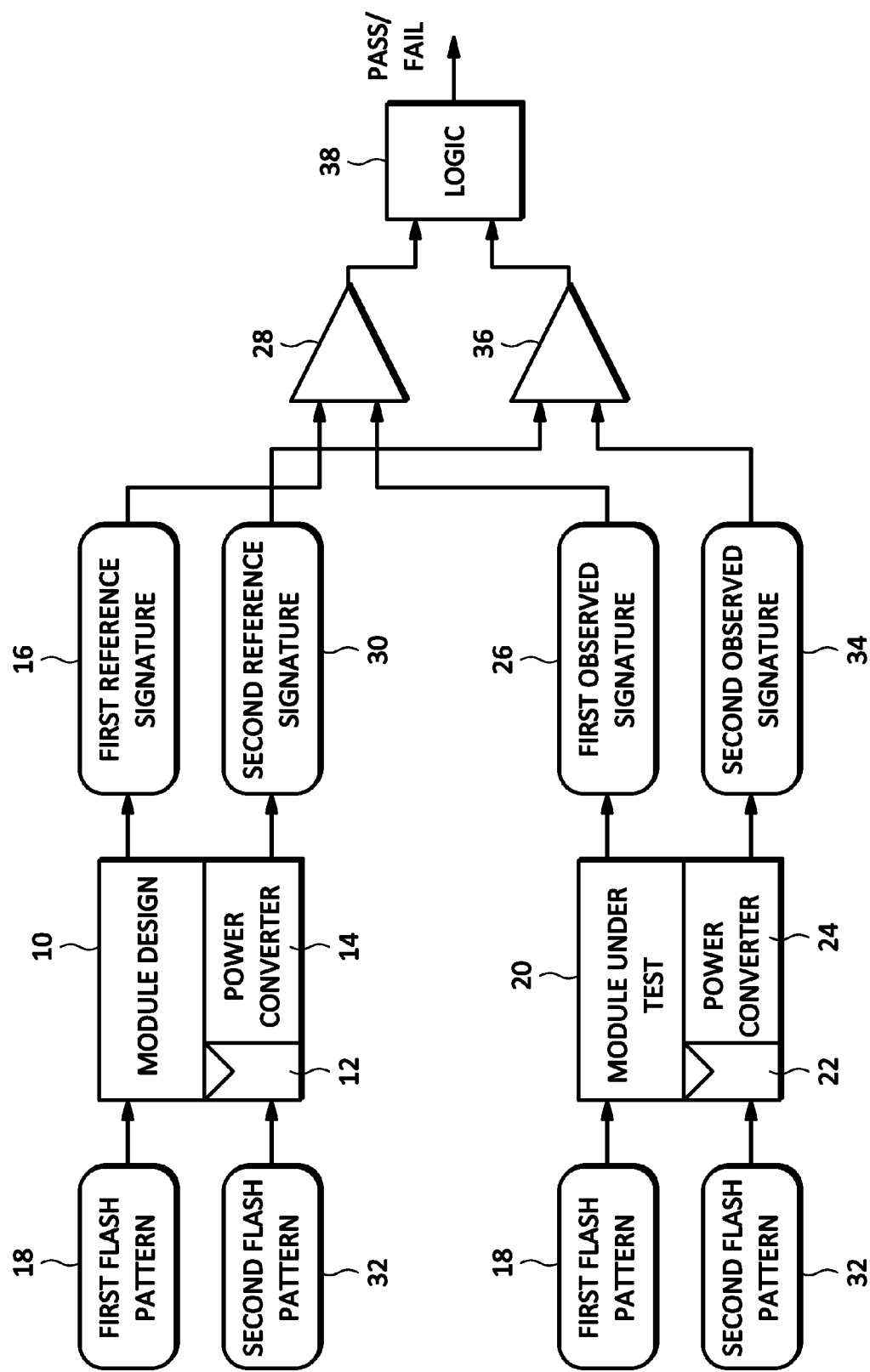
FIG. 8 illustrates another embodiment of a system for testing a PV module having an integral power converter according to some inventive principles of this patent disclosure.

FIG. 8 illustrates another embodiment of a system for testing a PV module having an integral power converter according to some inventive principles of this patent disclosure. The embodiment of FIG. 8 includes the same elements as the embodiment of FIG. 2, but in the embodiment of FIG. 8, a second reference output signature 30 for the module design 10 is obtained in response to a second flash pattern 32. During testing, the second flash pattern 32 is applied to the PV module under test 20, and a second observed output signature 34 of the PV module under test 20 is acquired in response to the second flash pattern 32.

The second observed output signature 34 is compared to the second reference output signature 30 through comparison logic 36. As in the embodiment of FIG. 2, the first observed output signature 26 is compared to the first reference output signature 16 through comparison logic 28. The outputs from comparison logic 28 and 36 may then be further processed through additional comparison and/or decision making logic 38 to determine whether the module under test falls within acceptable tolerances of the target specifications.

As with other embodiments, the module design 10 may be a physical or simulated embodiment, the reference output signatures may be obtained through simulation or observation of a known good module, any of the logic may be implemented with hardware, software, firmware, or any suitable combination thereof, etc.

Figure 9:
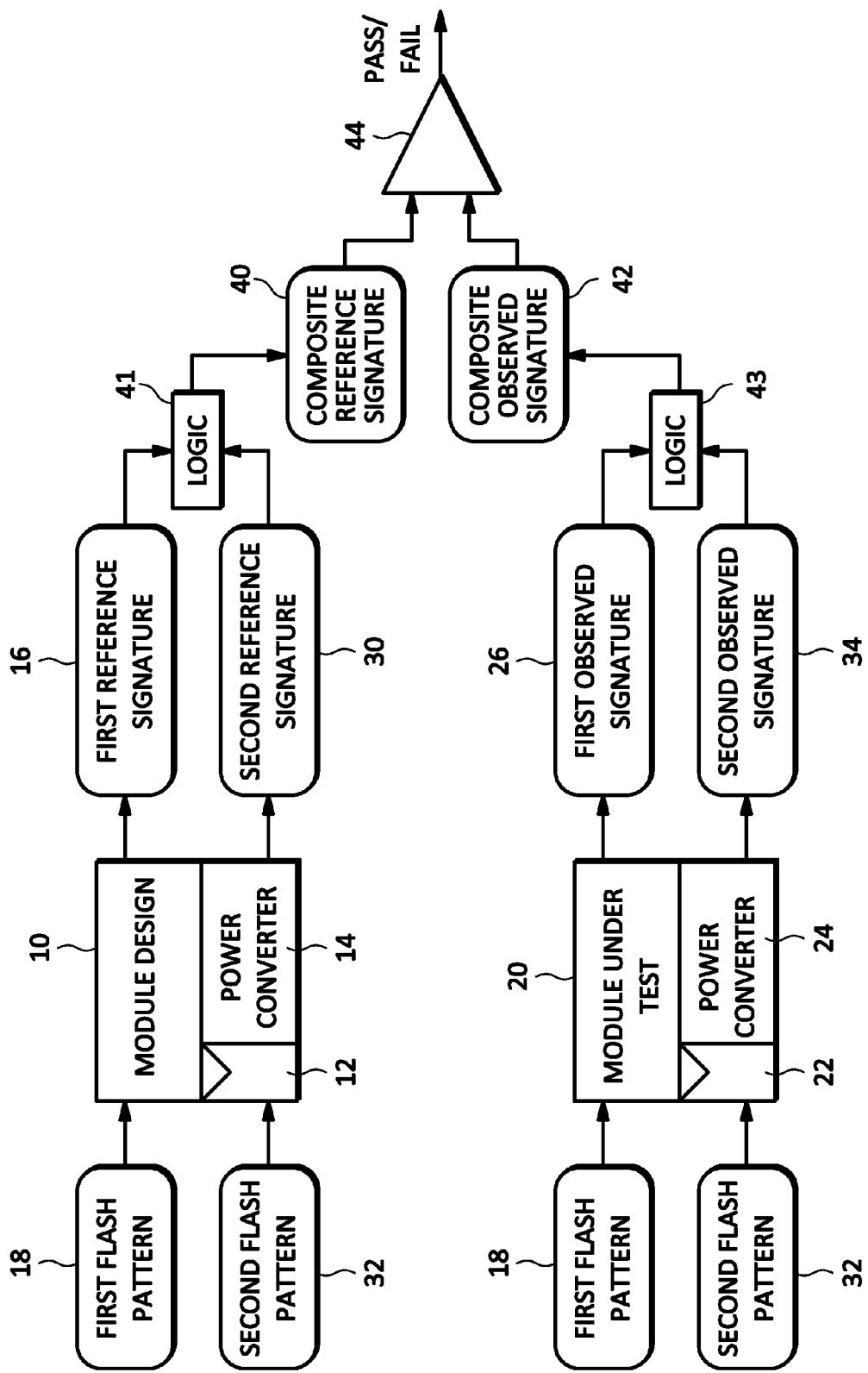
FIG. 9 illustrates another embodiment of a system for testing a PV module having an integral power converter according to some inventive principles of this patent disclosure.

FIG. 9 illustrates another embodiment of a system for testing a PV module having an integral power converter according to some inventive principles of this patent disclosure. The embodiment of FIG. 9 is similar to that of FIG. 8, but rather than comparing the individual observed output signatures to their respective reference output signatures, the first and second reference output signatures are combined by logic 41 to generate a composite reference output signature 40, and the first and second observed output signatures are combined by logic 43 to generate a composite observed output signature 42. The composite observed output signature 42 is then compared to the composite reference output signature 40 with comparison logic 44 to determine whether the module under test falls within acceptable tolerances.

The individual output signatures may be combined to generate composite output signatures using time domain techniques, frequency domain techniques, time-frequency domain techniques or any other suitable technique.

Figure 10:
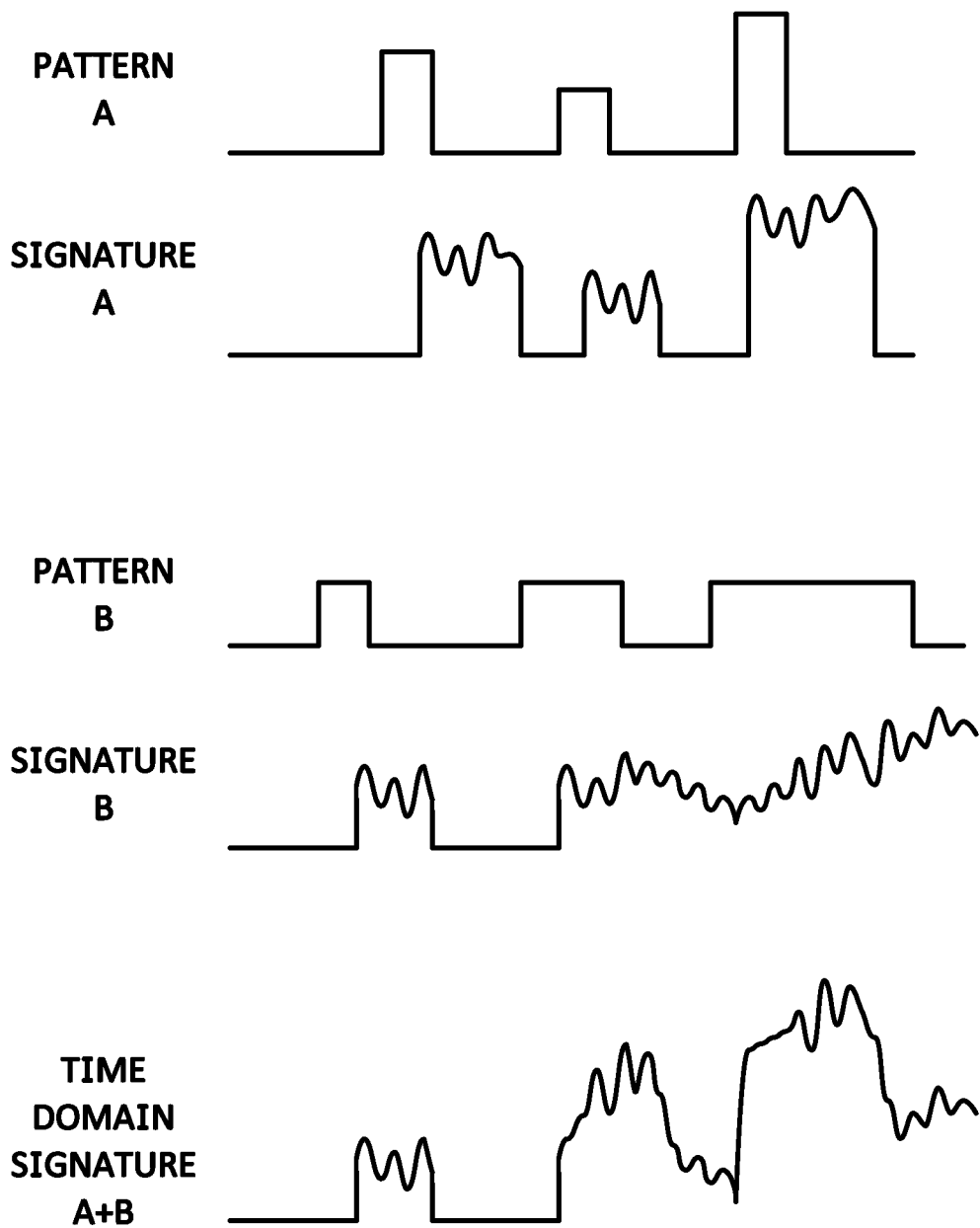
FIG. 10 illustrates an example embodiment of a test method in which to flash patterns are applied to a module design and/or module under test according to some inventive principles of this patent disclosure.

FIG. 10 illustrates an example embodiment of a test method in which flash patterns A and B are applied to a module design and/or module under test to generate extended output signatures A and B which are shown as generic waveforms for purposes of illustration. The extended output signatures A and B may be combined in the time domain as shown in FIG. 10. The combined extended output signatures may be adequate to characterize the response of the module under test, especially with modules that exhibit high levels of linearity.

Figure 11:
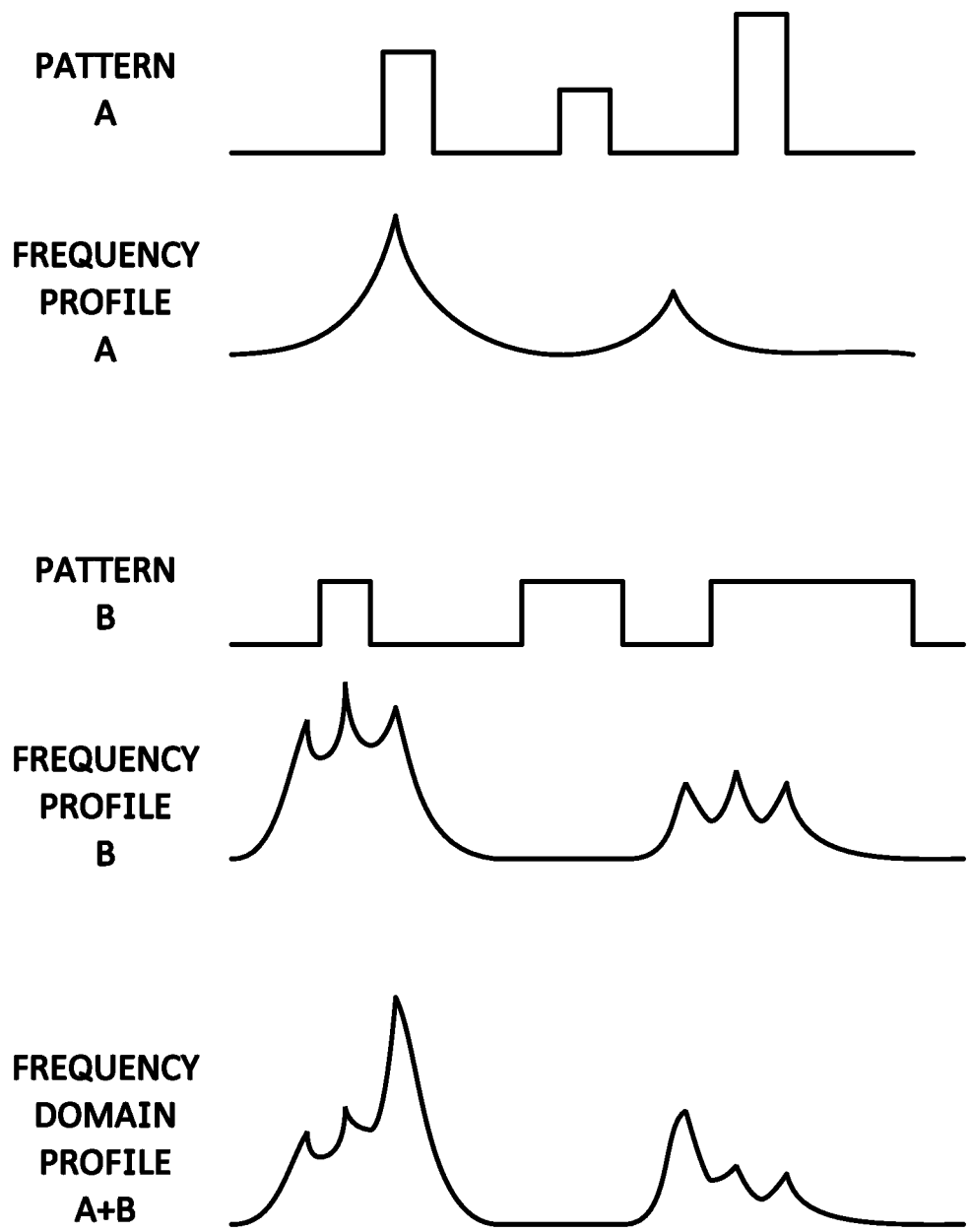
FIG. 11 illustrates an embodiment in which extended output signatures are combined in the frequency domain according to some inventive principles of this patent disclosure.

Alternatively, the extended output signatures A and B may be combined in the frequency domain as shown in FIG. 11, where each of the extended output signatures are transformed to the frequency domain, shown here as generic spectral profiles. The spectral profiles may then be added to generate a combined spectral profile. The frequency domain approach may enable the verification of operating characteristics of modules under test that may be difficult or impossible to recognize using time domain combination, especially with modules that exhibit high levels of nonlinearity.

Figure 12:
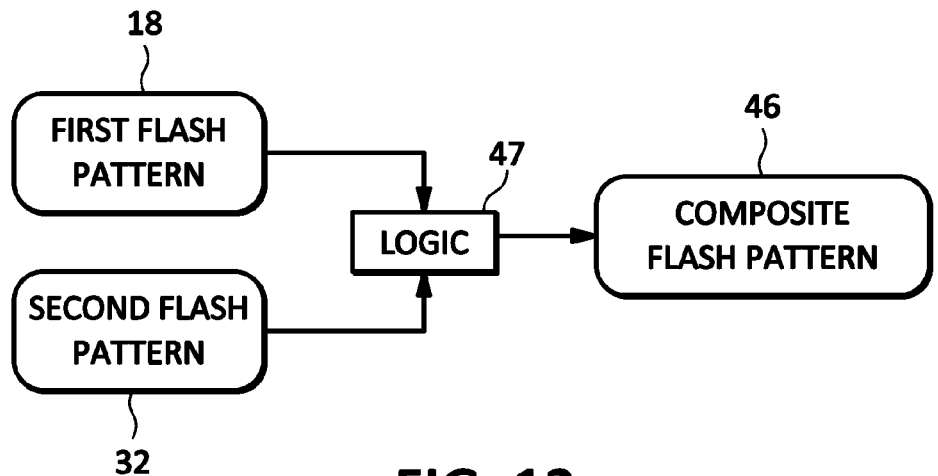
FIG. 12 illustrates an embodiment in which flash patterns are combined through addition in the time domain according to some inventive principles of this patent disclosure.
Figure 13:
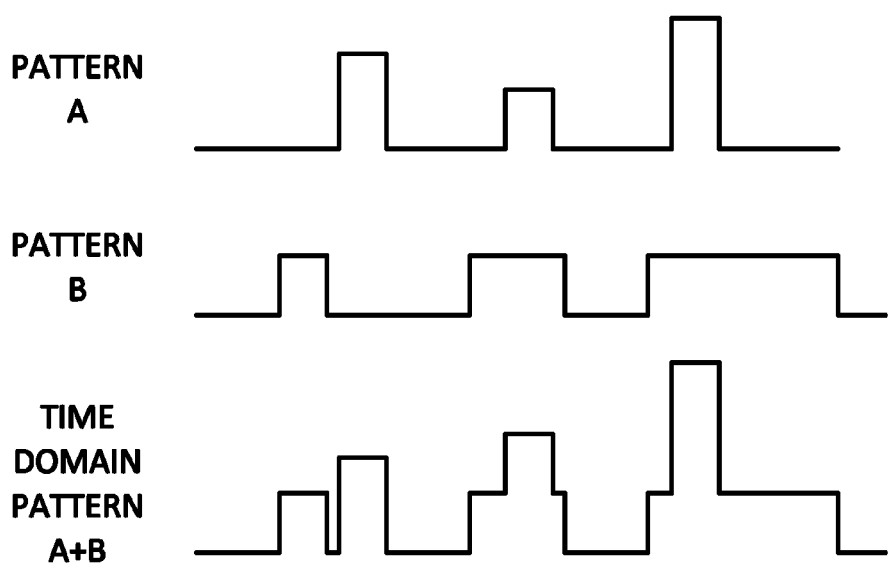
FIG. 13 illustrates an embodiment in which flash patterns are combined in the time domain according to some inventive principles of this patent disclosure.

The flash patterns may also be combined in any suitable manner. For example, FIG. 12 illustrates an embodiment in which first and second flash patterns 18 and 32 are combined by logic 47 through addition in the time domain to generate a composite flash pattern 46 which may then be applied to a module design or module under test, and the resulting signature analyzed in the time and/or frequency domain or other suitable method. FIG. 13 illustrates an example embodiment in which first flash pattern A and second flash pattern B are combined in the time domain to generate a composite flash pattern A+B.

The flash patterns may be physically combined in any suitable manner. For example, a first pattern A may be generated with a first flash lamp, while a second pattern B may be generated simultaneously with a second flash lamp. Thus, there may be different time periods when the module under test is illuminated only by the first lamp, only by the second lamp, or by both lamps at the same time. Alternatively, a single flash lamp may be used to generate the composite pattern by operating at a first radiance level when only pattern A is active, a second radiance level when only pattern B is active, and a third level when patterns A and B are both active.

Although the embodiments of FIGS. 8-13 are illustrated with only two different flash patterns, any suitable number of flash patterns may be used in accordance with the inventive principles of this patent disclosure. Moreover, one or more sub-sets of techniques, signatures and/or flash patterns may be locally determined to optimize test coverage with a minimum of equipment and test time during manufacture of modules having integral power converters according to the inventive principles of this patent disclosure.

As a further enhancement, signatures may be obtained and acquired by shadowing portions of the arrangements of PV cells using shadow patterns having various shapes and transparencies. For example, first reference and observed signatures may be obtained and acquired in response to a first flash pattern with no shadowing of the module design or module under test. Second reference and observed signatures may then be obtained and acquired in response to a second flash pattern with a predetermined shadowing pattern applied to the module design and module under test. The first and second flash patterns may be the same or different. The observed signatures may then be compared to the corresponding reference signatures as, for example, in the embodiment of FIG. 8 described above. Alternatively, the signatures may be combined to generate composite signatures prior to comparison, for example, as shown in the embodiment of FIG. 9.

Figure 14A:
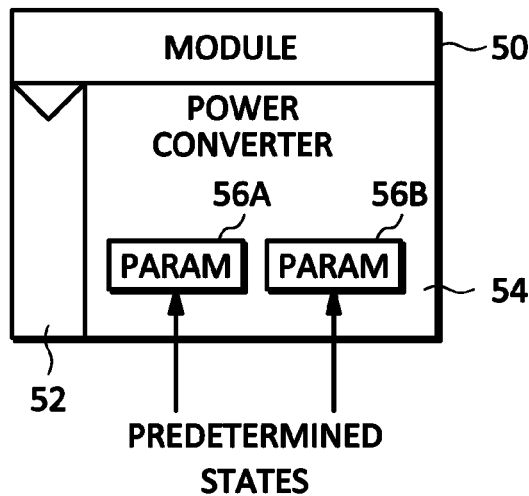
FIGS. 14A through 14C illustrate another method and apparatus for testing a PV module having an integrated power converter according to some inventive principles of this patent disclosure.
Figure 14B:
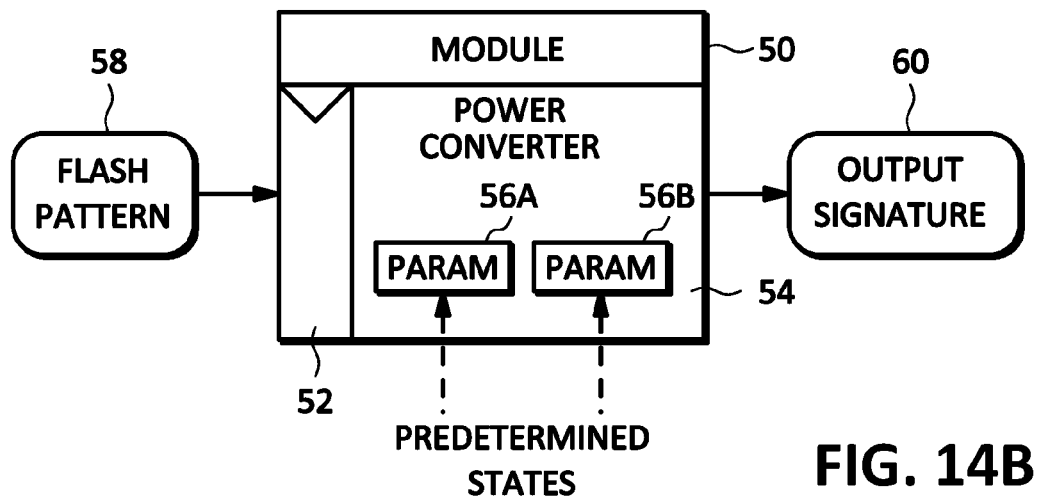
Figure 14C:
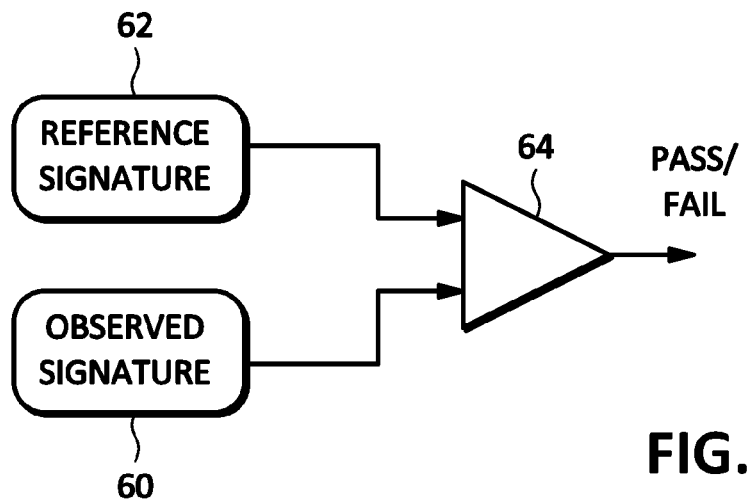

FIGS. 14A through 14C illustrate another method and apparatus for testing a PV module having an integrated power converter according to some inventive principles of this patent disclosure. Referring to FIG. 14A, a PV module under test 50 includes an arrangement of PV cells 52 and an integrated power converter 54 to process power from the cells. The power converter 54 includes one or more parameters 56A, 56B that are preset to predetermined states prior to application of a flash pattern. The parameters may include node voltages, bias currents, logic states, power supply states, and any other parameters that, by presetting them to predetermined states, may facilitate the generation of an output signature that is useful for evaluating a module under test in response to one or more flash patterns.

Referring to FIG. 14B, a flash pattern 58 is applied to the module under test 50, and an observed output signature 60 of the PV module under test is acquired in response to the flash pattern. The presetting of the parameters to predetermined states is now shown in broken lines to indicate that the parameters may be released prior to applying the flash pattern, or may be maintained in the predetermined states during the application of all or part of the flash pattern.

The method and apparatus described so far in the context of FIGS. 14A and 14B relate to a module under test, but the same or similar method and apparatus may be used to obtain a reference output signature for a corresponding module design, either by simulation or by applying the flash pattern to an actual known good module.

Referring to FIG. 14C, the observed output signature 60 of the PV module under test is compared to the reference output signature 62 through suitable comparison logic 64 to determine whether the module under test falls within acceptable tolerances of the target specifications.

The flash pattern 58 may include multiple light pulses, in which case the reference output signature and the observed output signature may include extended output signatures. The one or more parameters 56A, 56B may be preset a first time before a first one of the light pulses and may be preset a second time before a second one of the light pulses. For example, as shown in FIG. 15, different preset patterns A, B, C and D may be applied to the parameters before each of the multiple light pulses which generate the output signature shown in FIG. 15.

Figure 16:
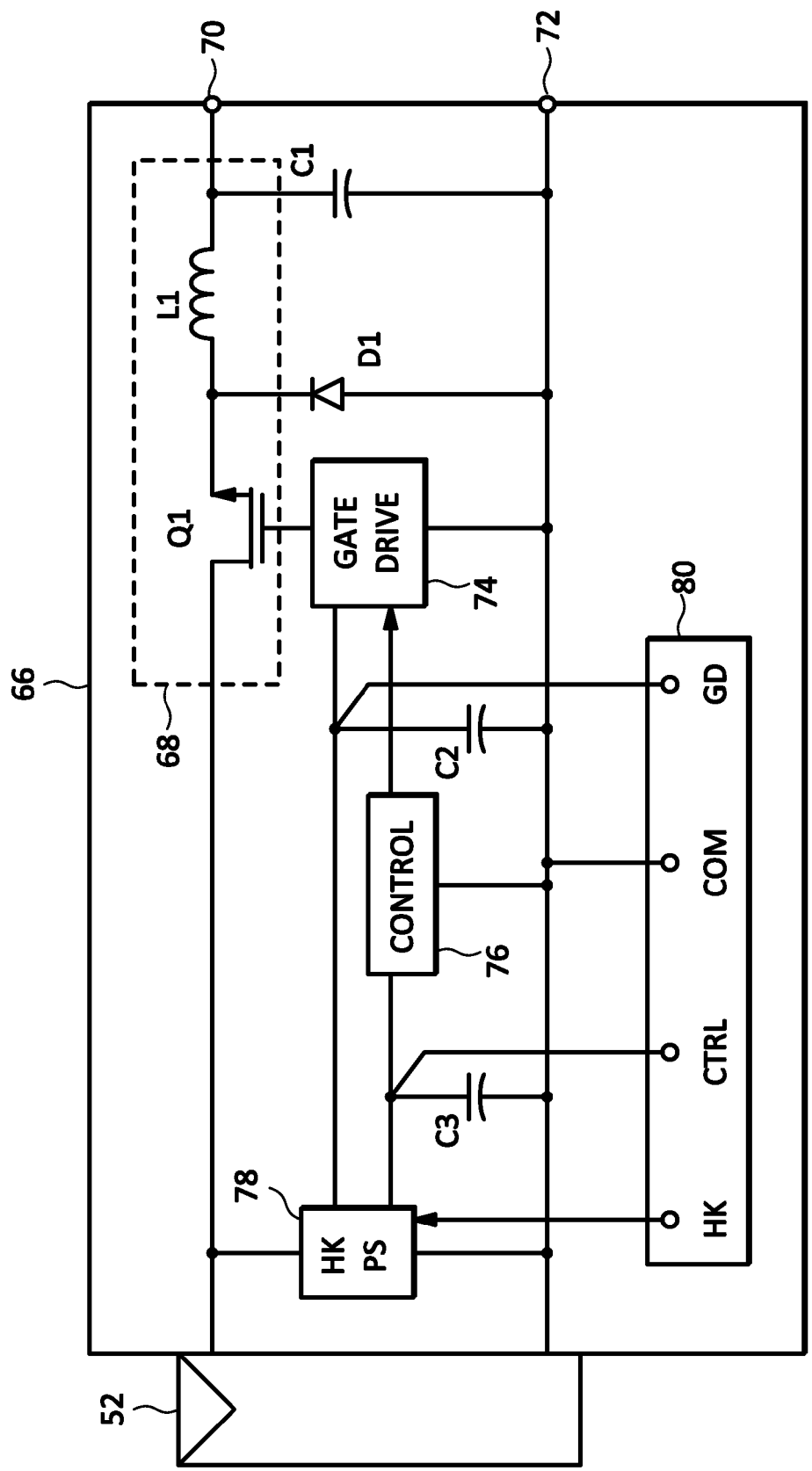
FIG. 16 illustrates an example embodiment of a PV module having an integrated power converter according to some inventive principles of this patent disclosure.

FIG. 16 illustrates an example embodiment of a PV module having an integrated power converter 66 according to some inventive principles of this patent disclosure. The power converter 66 includes a power train 68 having a power switch Q1 and an inductor L1 arranged in a buck configuration with a diode D1 and output capacitor C1. The power train 68 is arranged to convert power from the PV cells 52 to a different voltage and current at power output terminals 70 and 72, which are brought out to high-current terminals on the housing of the power converter 66.

The power converter also includes a gate drive circuit 74 to drive the switch Q1 in response to a controller 76. A house keeping power supply 78 taps a small amount of power from the PV cells 52 to provide operating power to the controller 76 and gate drive circuit 74.

A connector 80 provides access to certain nodes through the housing of the power controller. In this example, access is provided to a node COM at a common connection node, a node GD on capacitor C2 at the power supply input to the gate drive circuit 74, a node CTRL on capacitor C3 at the power supply input to the controller 76, and a node HK at an input to the house keeping power supply 78.

In one example implementation, capacitors C2 and C3 are precharged to normal operating levels through GD and CTRL while the house keeping power supply is bootstrapped through HK. Nodes GD and CTRL are then released just before the flash pattern is applied. This enables the power converter to operate normally without any latency when the flash is applied to the PV cells 52. In another example, the GD connection may be arranged to cause the gate drive to switch Q1 to always remain on thereby enabling the power train during the flash pattern to simulate, to the extent possible, the raw output from the PV cells 52 appearing at the power output terminals 70 and 72 through the switch Q1 and inductor L1.

In general, if the controller is implemented digitally, e.g., using a micro-controller, an additional digital interface may be included to preset digital states of the controller, thereby enabling easier testing of the entire PV Module.

Module Testing Using Power Reversal

Some additional inventive principles of this patent disclosure relate to using power reversal to test a module with an integrated power converter. Power reversal involves applying input power to the terminals that are normally used to extract the output power from the module. As explained in more detail below, the inventive principles contemplate a wide range of techniques in which power reversal may be used to facilitate testing a module with an integrated power converter. For example, in one embodiment, input power may be applied to the output terminals merely to provide a bootstrap power supply for the electronics in a PV module that will be tested with flash testing as described above, thereby eliminating the time delay normally associated with inherent energy storage, algorithmic latencies, etc. In such an embodiment, the power train need not be fully reversible, but may only be reversible to the extent that it can transfer a relatively small amount of input power from the normal output terminals to a housekeeping power supply.

In another embodiment, however, the power train may be fully reversible in the sense that it can transfer all, or a large percentage of, the full rated power of the power converter backwards into the PV cells of a darkened module to characterize the PV cells as they operate like diodes with a certain series-shunt combination of parasitic capacitance and resistance elements. In such an embodiment, essentially all of the power required to test the module is applied to the normal output terminals. Between and beyond these two examples is an entire range of techniques as described below.

Figure 17:
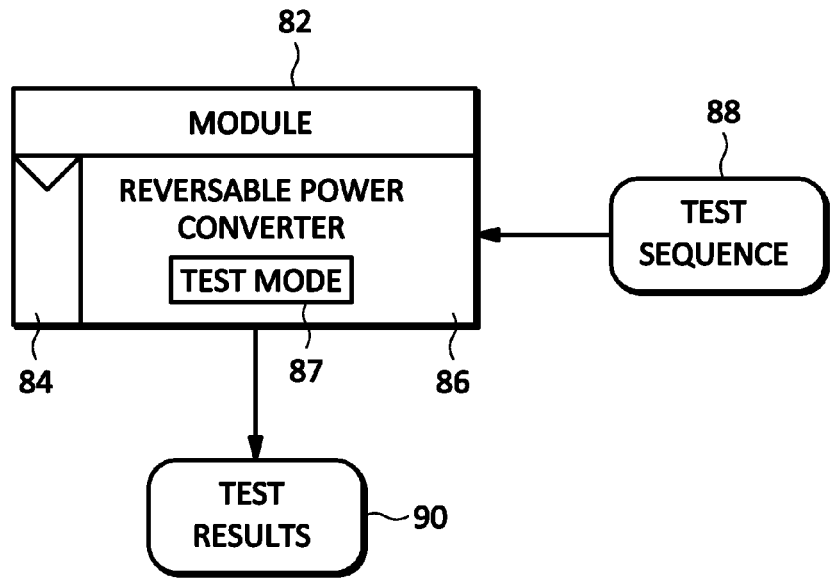
FIG. 17 illustrates an embodiment of a system for testing a PV module having an integral power converter according to some inventive principles of this patent disclosure.

FIG. 17 illustrates an embodiment of a system for testing a PV module having a reversible integral power converter according to some inventive principles of this patent disclosure. The embodiment of FIG. 17 includes a module 82 having PV cells 84 and power converter having a reversible power train 86. A test sequence 88 is applied to the normal output terminals of the reversible power train 86, thereby producing test results 90. The reversible power train 86 includes test mode functionality 87 that enables the PV module to determine when it is being placed in a test mode.

Figure 18:
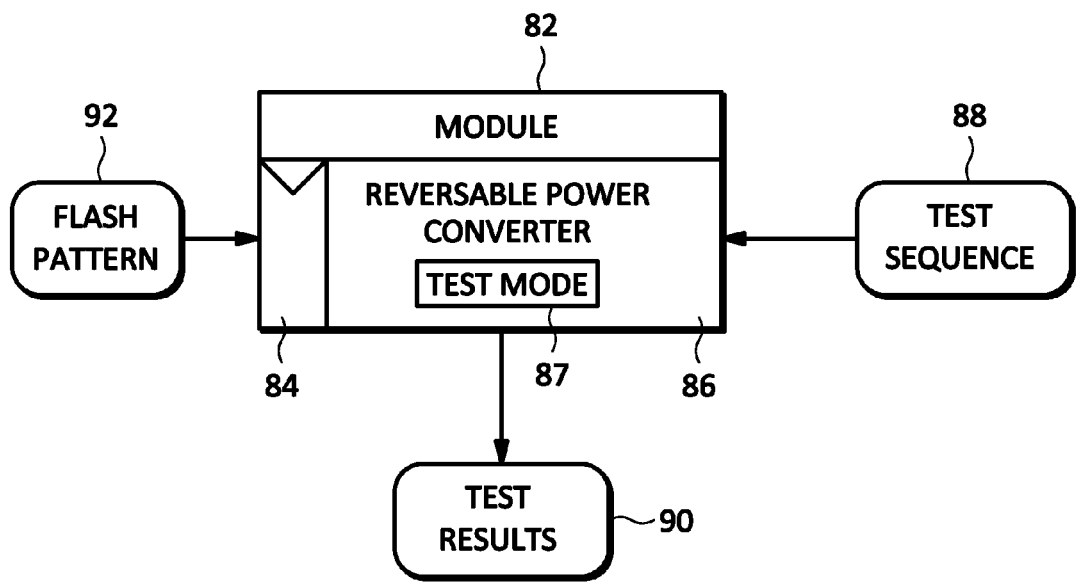
FIG. 18 illustrates another embodiment of a system for testing a PV module having an integral power converter according to some inventive principles of this patent disclosure.

FIG. 18 illustrates another embodiment of a system for testing a PV module having a reversible integral power converter according to some inventive principles of this patent disclosure. The embodiment of FIG. 18 is similar to that of FIG. 17 but also includes an illumination pattern 92 such as a flash pattern or continuous illumination pattern that may be applied to the PV cells 84 during a test operation.

In either of these embodiments, the reversible power train 86 and test mode functionality 87 may take many different forms, as may the corresponding test sequence 88, test results 90 and illumination pattern 92. For example, the reversible power train may include any type of device that may be integrated into a PV panel such as a power optimizer, a maximum power point tracking (MPPT) device, a charge controller, a microinverter, etc.

In some implementations in which the power converter is a DC-DC power converter, the test sequence 88 may include applying a DC voltage to the output terminals of the power converter. The DC voltage may be a constant voltage in a normal operating range of the converter, or it may be a specific voltage that is outside the normal operating range to signal the beginning of a test operation. Alternatively, the DC voltage may have a specific pattern to signal the beginning of a test operation and/or to provide a stimulus to the module in a way that provides useful test results Likewise, in some implementations in which the power converter includes a DC-AC inverter, a steady or changing AC voltage may be applied to signal the beginning of a test operation and/or to provide a stimulus for testing.

The test sequence 88 may include an explicit or implicit signal that is interpreted by the test mode functionality 87 to indicate that the reversible power converter should enter a test mode in which the operation of the power train is at least partially reversed. An explicit test mode signal is conceptually separate from the reverse input power that is applied to the power converter, but it may be physically integral with the reverse input power. For example, a test mode signal may take the form of a digital test mode command that is modulated onto an AC or DC voltage reverse input power source using power ling communications (PLC) and demodulated by a PLC receiver in a controller in the power converter. In other embodiments, an explicit test mode signal may be physically separate from the reverse input power, e.g., it may be transmitted to a controller in the power converter through a separate wired or wireless communication interface.

An implicit test mode signal, however, is essentially inseparable from the reverse input power or other test stimulus that is applied to the power converter. For example, in some embodiments, the very fact that reverse input power is applied to the power converter may be sensed by the test mode functionality 87 to indicate that the reversible power converter should enter a test mode in which the operation of the power train is at least partially reversed.

Regardless of the manner in which test mode functionality 87 detects the beginning of a test operation, it may then activate the entire power-train control and may further activate on-board communication capabilities. The communication capabilities may be wired or wireless and may further be used to initiate, control, diagnose, monitor and/or obtain the results of entire test sequences. Alternatively, test sequences may reside as pre-programmed sequences on the module under test and may automatically run a variety of self-tests.

The test results 90 may be obtained in any suitable manner. For example, in some embodiments, test results may be gathered by data acquisition apparatus within the module and communicated outside of the module through a separate wired or wireless communication interface or through a PLC interface through the output terminals. In other embodiments, the module may include some type of visual indicator such as an LED that may be illuminated with a color and/or flashing pattern to indicate a pass/fail test result. The visual pattern may also be encoded to communicate information such as a reason for failure, calibration constant, etc.

Some embodiments may be implemented with unidirectional reverse power flowing one-way into the output terminals of the power converter. In such embodiments, some or all of the test results may be obtained, for example, by applying a fixed or variable voltage to the output terminals and observing the signature of the input current flowing into the output terminals. This type of embodiment may be used, for example, to test the power train in the integrated power converter and to test and characterize darkened PV cells by applying reverse power to the PV cells through the reversible power train.

Other embodiments may be implemented with bi-directional power flowing into and out of the output terminals of the power converter. In such embodiments, some or all of the test results may be obtained, for example, by coupling a fixed or variable voltage source that may both source and sink current to the output terminals and observing the signature of the current flowing into and out of the power terminals. This type of embodiment may be used, for example, in a hybrid arrangement in which a fixed or variable voltage is applied to the output terminals, but the PV cells are simultaneously modulated using flash patterns, or continuous illumination of a variety of irradiation intensities, periods and durations. In this case, the PV cells act as a current source in addition to a diode with the parasitic resistive and capacitive elements. The effective current flow is the resultant of the current generated by the PV cells and the current sourced by the active power source at the output.

Although the overall primary goal is to test PV panels having integrated electronics, the inventive principles also enable the characterization of individual PV cells, and many other useful tests including determining the characteristics of sub-strings of PV cells and/or the entire array of PV cells on a module, power-train functionality and performance, verification of correct encoding of controller firmware and functionality, correct configuration of registers, correct analog and digital sub-circuit behavior, appropriate functionality of variety of regulators and power supplies, functionality of communication circuits, etc.

As mentioned above, tests may be further augmented by varying and monitoring the input voltage and/or input current being sourced into the output terminals of the module under test. During the entire testing process, the module may be kept completely dark, or it may optionally be combined with flash patterns or other illumination patterns which may use various irradiation intensities with varying periods and duration. Accuracy enhancement may be incorporated by adding calibrated light-sensors that measure illumination intensities during tests with flash patterns or other illumination patterns. The resulting signatures associated with flash or other illumination testing may be sensed at the voltage and/or current sources used for the power reversal process and may be acquired using a high-speed data acquisition system. The corresponding signatures may be compared with those obtained through simulation and/or with those obtained through the use of known good samples. The obtained signatures, along with entire acquired data-set, may further use frequency and/or time-domain processing to simplify deductive decision making to determine pass/fail compliance to target manufacturing specifications. The signatures can also be obtained by shadowing one or multiple pieces of the module using various shapes of arbitrary shadowing material of various transparencies.

Although signature sensing is described above in the context of sensing signatures at the voltage and/or current sources used for the power reversal process, i.e., at the output of the module, a signature may be obtained for virtually any signal within a module with integrated electronics that can be sampled by an internal digitizer, such as that described below in FIG. 19, or an external digitizer, such as that described below in FIG. 20.

Figure 19:
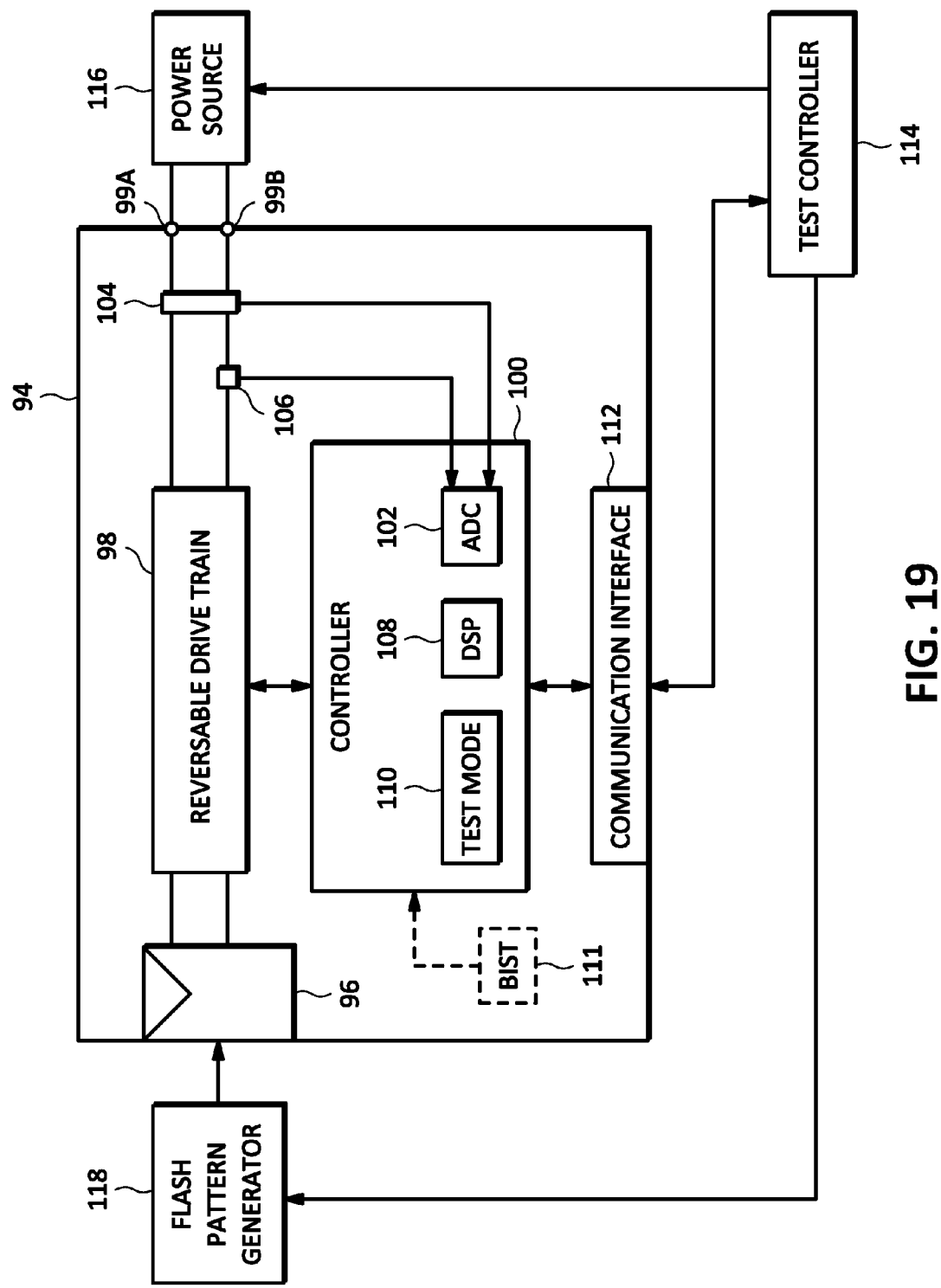
FIG. 19 illustrates an example embodiment of a method and apparatus for testing a PV module according to some inventive principles of this patent application.

FIG. 19 illustrates an example embodiment of a method and apparatus for testing a PV module according to some inventive principles of this patent application. The embodiment of FIG. 19 relies on internal voltage and current sensing apparatus to collect the test results which are reported through a communication interface. The module 94 includes an array of PV cells 96 and a power converter with a reversible drive train 98 having normal output terminals 99A and 99B. A controller 100 includes a multi-channel analog-to-digital converter (ADC) 102 that digitizes signals from voltage sensor 104 and current sensor 106. The controller also includes a digital signal processor (DSP) 108 to perform real-time processing of the output voltage and current from the drive train, as well as other points throughout the drive train and module to implement MPPT algorithms, phase and frequency control, harmonic distortion reduction, etc., in the drive train.

Test mode sense logic 110 senses a test mode signal to enable the controller to determine when it should enter test mode. The test mode signal may be implicit, e.g., in the application of a reverse power source to the output terminals 99A and 99B of the drive train. Alternatively, the test mode signal may be explicit in the form of a digital command received through a communication interface 112. The communication interface enables test results collected through the ADC to be transferred to a test controller 114. The communication interface may be wireless, e.g., WiFi, Bluetooth, cellular, etc., or wired, e.g., RS485, PLC, etc., or some combination thereof.

The reversible drive train may include any suitable arrangement of power stages including buck converters, boost converters, buck-boost converters, inverters, EMI filters, etc. Some examples include a buck-boost topology in which freewheeling diodes are replaced with transistor switches that operate as synchronous rectifiers, or a bi-directional flyback converter topology.

A test controller 114 controls the overall testing operation by activating a reverse power source 116, as well as a flash pattern generator 118 at coordinated times to execute a test procedure suitable for the particular module under test. For example, the controller 100 in the module 94 may include a memory 111 having a pre-programmed sequence of operations to run a built-in self-test (BIST) in response to detecting a certain voltage applied to the output terminals 99A and 99B by reverse power source 116. The application of the reverse voltage enables the power converter to charge any inherent energy storage devices and boot up quickly, configure the drive train 98 for reverse operation, and test the operation of the drive train while it is receiving reverse power and the PV cells 96 are behaving as diodes.

The test controller 114 may then cause the reverse power source 116 to apply any suitable pattern of voltage and/or current waveforms to the output terminals 99A and 99B. The resulting current and/or voltage signatures sensed by the voltage sensor 104 and the current sensor 106 are then digitized by the ADC 102, optionally processed by the DSP 108, then transmitted to the test controller 114 through the communication interface 112. The test data may be transmitted immediately upon collection, or it may be buffered in local storage in the controller 100 before being transmitted to the test controller 114. Alternatively, one or more reference signatures may be stored locally within the module 94 and compared to the resulting current and/or voltages signatures during a BIST with only pass/fail results communicated to the test controller 114. Thus, essentially complete verification functionality may be built into the module.

The test controller 114 may activate the flash pattern generator 118 to apply a flash pattern to the PV cells 96 at any suitable time during the test procedure, thereby enabling the controller 100 to record the resulting current and/or voltage signatures generated in response to a combination of reverse power waveforms applied to the outputs of the drive train and flash patterns applied to the PV cells. This may enable the system to utilize power reversal to optimally turn on the power train, then use a combination of reverse power patterns and flash patterns to obtain test results, e.g., current and voltage signatures and other test data, that provide complete visibility of the operation of the entire module. The observed signatures may then be compared to reference signatures obtained through simulation or from known good modules to evaluate the module under test.

Although the embodiment of FIG. 19 may provide efficient and economical testing, the internal voltage and current sensing apparatus such as the ADC and DSP hardware may limit the effectiveness of the test process. I.e., the internal sensing apparatus may be adequate for use during normal operation of the module, but more robust data acquisition apparatus may enable the system to more completely sense the output signature, thereby improving test performance.

Figure 20:
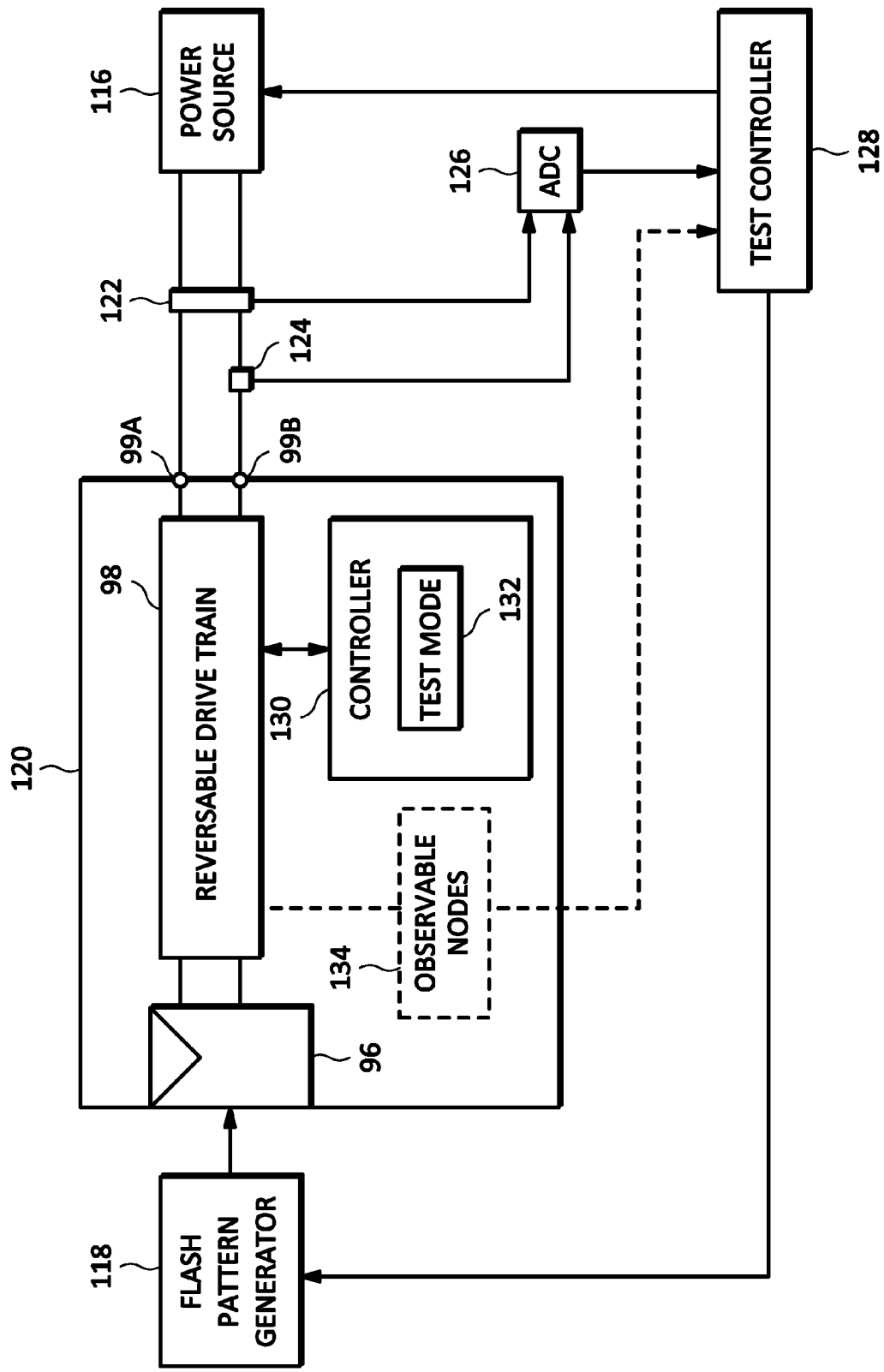
FIG. 20 illustrates another example embodiment of a method and apparatus for testing a PV module according to some inventive principles of this patent application.

FIG. 20 illustrates another example embodiment of a method and apparatus for testing a PV module according to some inventive principles of this patent application. The embodiment of FIG. 20 utilizes a high performance external data acquisition system to obtain more thorough output signatures, thereby improving the accuracy and/or reducing the time required for the test process. The module 120 includes an arrangement of PV cells 96 and a reversible drive train 98 having output terminals 99A and 99B.

A reverse power source 116 is coupled to the output terminals 99A and 99B through a voltage sensor 122 and a current sensor 124, the outputs of which are digitized by a high-speed, multi-channel ADC 126. A test controller 128 controls the overall testing operation by activating the reverse power source 116, as well as a flash pattern generator 118 at coordinated times to execute a test procedure suitable for the particular module under test. The test controller 128 also collects the test data from the ADC and compares the observed signatures to reference signatures obtained through simulation or from known good modules to make the pass/fail determination.

The module 120 also includes a controller 130 that controls the operation of the drive train 98 and other components of the module during normal and test operation. In this embodiment, the controller includes test mode logic 132 that determines the beginning of a test operation by sensing a specific voltage, current, or waveform thereof, applied to the output terminals 99A and 99B. Though not shown, the controller would typically include additional ADC and DSP hardware for controlling the drive train during normal operation. The additional hardware may not be used during a test operation in view of the high-performance characteristics of the external ADC 126. Alternatively, the additional internal ADC and DSP hardware may be used to provide supplemental data acquisition of output signatures or other test data which may then be transmitted to the test controller 131 through any suitable technique, for example through an optional communication interface.

The module 120 may optionally include a connector 134 that provides access to one or more observable nodes in the module for the high-speed ADC 126. The may enable the test controller 131 to acquire test data on the performance of, for example, individual PV cells or strings of cells in the module.

Figure 21:
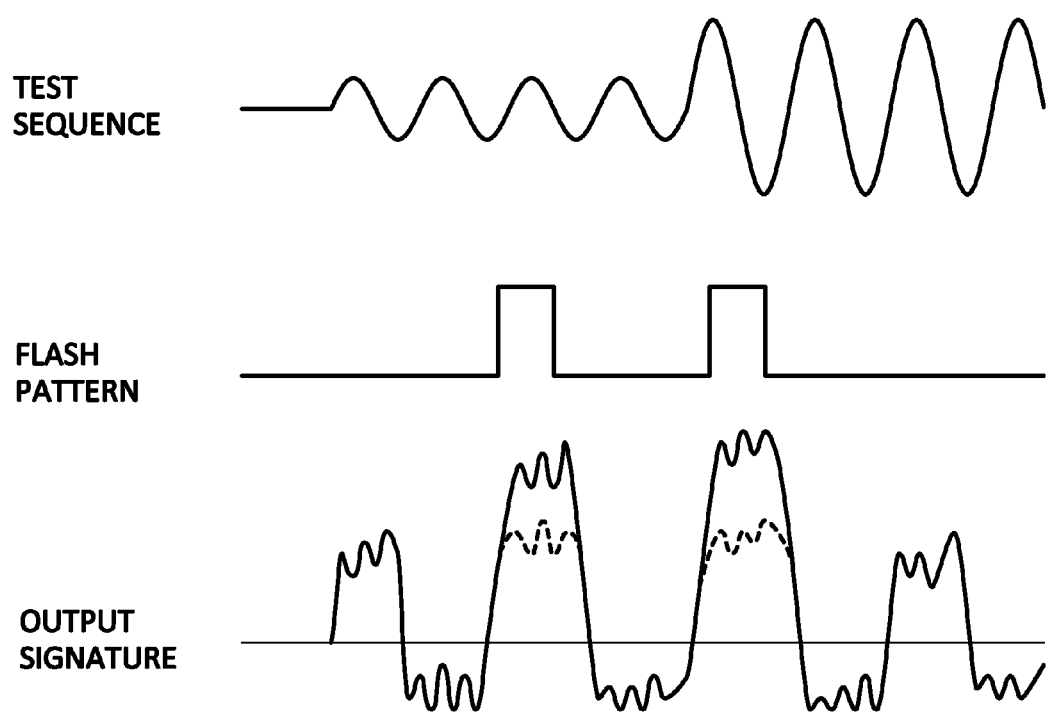
FIG. 21 illustrates some waveforms for an example embodiment of a method for testing a PV module according to some inventive principles of this patent application.

FIG. 21 illustrates some waveforms for an example embodiment of a method for testing a PV module according to some inventive principles of this patent application. The embodiment of FIG. 21 may be implemented generally, for example with the systems of FIGS. 17-20, and specifically with a system having a reversible AC-DC inverter in the drive train.

The top waveform illustrates a voltage pattern (reverse excitation voltage) for a test sequence that may be generated by a reverse power source and applied to the output terminals of a reversible drive train. The example shown in the top waveform begins with a 60 Hz sine wave at a relatively low voltage, than steps up to a higher voltage, still at 60 Hz.

The middle waveform illustrates a flash pattern that may optionally be applied to the PV cells of the module under test.

The bottom trace illustrates the current flowing into and out of the output terminals (output signature) in response to the combination of the reverse excitation voltage and the flash pattern. The broken line shows what the observed output signature would look like without the flash pattern, while the solid line shows the observed output signature in response to the combination of reverse excitation and flash exposure.

The waveforms shown in FIG. 21 are for purposes of illustration, and many other waveforms having varying degrees of reverse excitation and illumination may be utilized according to the inventive principles of this patent disclosure. For example, frequencies other than 60 Hz may be used, and the reverse excitation power may include a DC component plus an AC component to determine complex impedance of the drive train, the PV cells, and/or the entire system. A flash pattern may further be included to determine how the the impedances vary with illumination to determine the performance characteristics of the module under test without needing continuous illumination. Thus, the inventive principles enable the application of one or more perturbations to the module under test using reverse power that produces observable signatures, plus the application of one or more additional perturbations using illumination.

Moreover, one or more parameters of a power converter having a reversible drive train may be preset to predetermined states as described above with respect FIGS. 14A and 14B.

Figure 22:
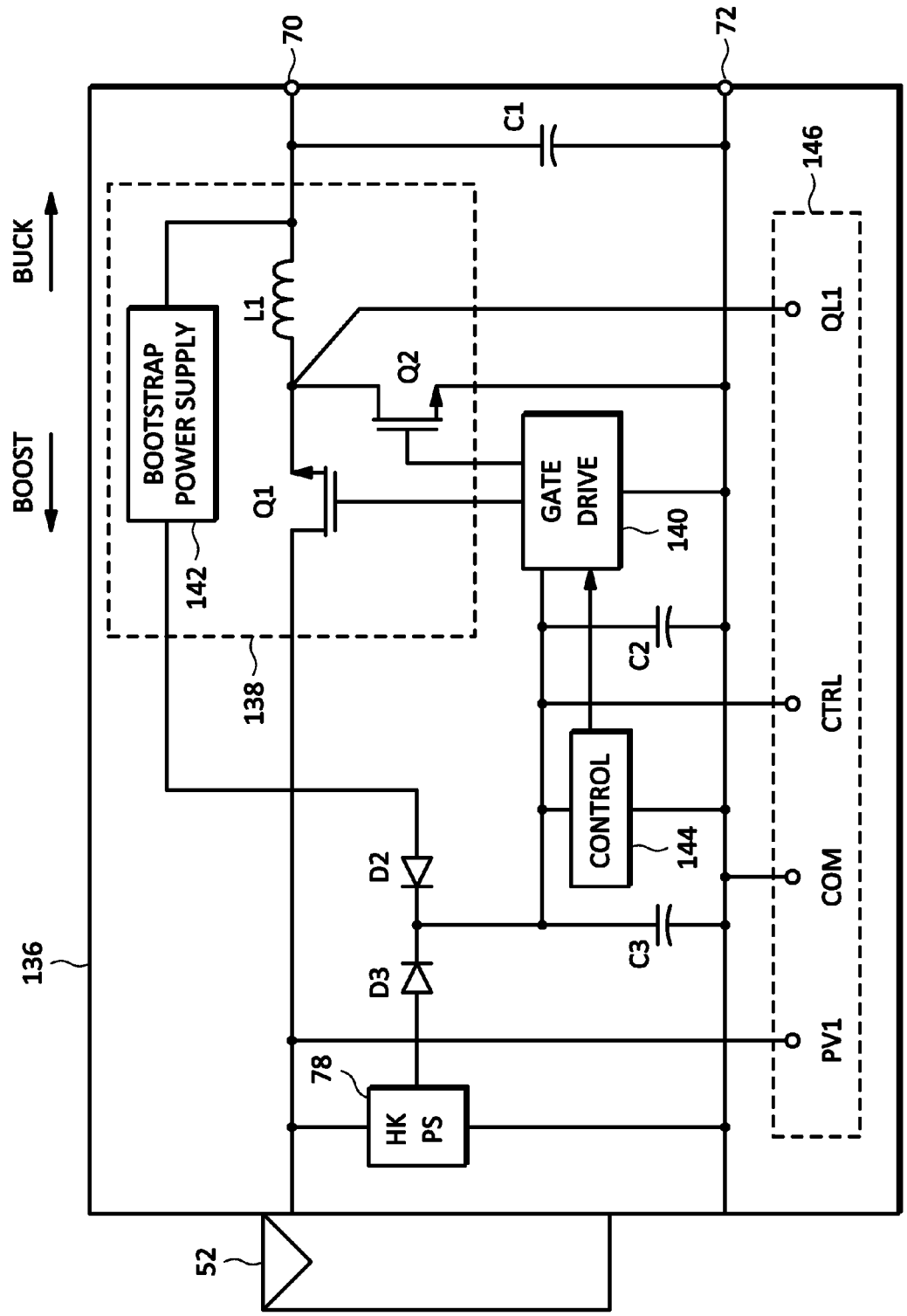
FIG. 22 illustrates some example implementation details for an embodiment of a PV module having a reversible drive train according to some inventive principles of this patent application.

FIG. 22 illustrates some example implementation details for an embodiment of a PV module having a reversible drive train according to some inventive principles of this patent application. The embodiment of FIG. 22 is similar to that of FIG. 16, but includes additional features to facilitate testing with power reversal. In the embodiment of FIG. 22, power converter 136 includes a drive train 138 in which the freewheeling diode D1 is replaced with a second power switch Q2 that is controlled by gate drive circuit 140. This enables the drive train to operate as a buck converter in the forward direction with Q1 operating as a normal switch and Q2 operating as a synchronous rectifier. In the reverse direction, the drive train operates as a boost converter with Q2 operating as a normal switch and Q1 operating as a synchronous rectifier.

To facilitate rapid power-up of the controller 144, a bootstrap power supply 142 generates a housekeeping power supply whenever a reverse voltage applied to the output terminals 70 and 72 exceeds a predetermined threshold. A normal housekeeping power supply 78 is diode ORed with the output of the bootstrap power supply 142 through diodes D2 and D3 so the controller can operate from either power supply. During a test operation, this enables the controller to power up and place the drive train in reverse mode long before the normal housekeeping power supply 78 could power up in response to a flash pattern applied to the PV cells 52.

An optional connector 146 enables various parameters to be preset to predetermined states and/or enables access to various observable points in the power converter for test purposes. In the example of FIG. 22, signal CTRL enables capacitors C2 and C3 to be precharged, while signals PV1 and QL1 enable monitoring of the PV panel voltage and the voltage across inductor L1, respectively.

The inventive principles of this patent disclosure have been described above with reference to some specific example embodiments, but these embodiments can be modified in arrangement and detail without departing from the inventive concepts. Such changes and modifications are considered to fall within the scope of the following claims.

The invention claimed is:

1. A photovoltaic (PV) module comprising:
   an arrangement of one or more PV cells;
   an integrated power converter to process power from the arrangement of one or more PV cells, wherein the integrated power converter is reversible;
   a pair of power outputs of the integrated power converter to couple the integrated power converter to a power source or load; and
   a controller to sense a test mode by sensing a test sequence applied to the pair of power outputs by a test controller and reverse a power flow to the arrangement of one or more PV cells from the integrated power converter in response to sensing the test mode.

2. The PV module of claim 1 wherein the integrated power converter comprises a bootstrap power supply to operate the controller in response to the test sequence applied to the pair of power outputs.

3. The PV module of claim 1 further comprising a communication interface to transmit test results in response to the test sequence applied to the pair of power outputs.

4. The PV module of claim 1 further comprising one or more observable points to provide test results in response to the test sequence applied to the pair of power outputs.

5. The PV module of claim 1 wherein the controller includes one or more pre-programmed sequences to run one or more self-tests.

6. The PV module of claim 1 wherein the controller includes sensing hardware to sense one or more output signatures in response to the test sequence applied to the pair of power outputs.

7. The PV module of claim 6 wherein the controller includes hardware to store one or more reference signatures and compare the one or more reference signatures to the one or more output signatures obtained through the sensing hardware.

8. A system comprising:
   a photovoltaic (PV) module having an arrangement of one or more PV cells and a reversible integrated power converter coupled to the arrangement of one or more PV cells and a controller coupled to the reversible integrated power converter;
   a power source coupled to a pair of power outputs of the reversible integrated power converter; and
   a test controller to control the power source to apply reverse excitation power to the pair of power outputs of the reversible integrated power converter and receive test results from the PV module, the controller being configured to sense a test mode by sensing a test sequence applied to the pair of power outputs by the test controller and reverse a power flow to the arrangement of one or more PV cells from the reversible integrated power converter in response to the test mode.

9. The system of claim 8 further comprising a flash pattern generator coupled to the test controller and arranged to apply a flash pattern to the arrangement of one or more PV cells.

10. The system of claim 8 wherein the test controller is coupled to a communication interface on the PV module to acquire one or more output signatures from internal hardware in the PV module.

11. The system of claim 8 further comprising a data acquisition system coupled between the PV module and the test controller to acquire one or more output signatures from the PV module.

* * * * *